(12) United States Patent
Mowry et al.

(10) Patent No.: US 7,939,399 B2
(45) Date of Patent: May 10, 2011

(54) SEMICONDUCTOR DEVICE HAVING A STRAINED SEMICONDUCTOR ALLOY CONCENTRATION PROFILE

(75) Inventors: Anthony Mowry, Dresden (DE); Bernhard Trui, Dresden (DE); Maciej Wiatr, Dresden (DE); Andreas Gehring, Dresden (DE); Andy Wei, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 356 days.

(21) Appl. No.: 11/866,461

(22) Filed: Oct. 3, 2007

(65) Prior Publication Data

US 2008/0203427 A1 Aug. 28, 2008

(30) Foreign Application Priority Data

Feb. 28, 2007 (DE) .......................... 10 2007 009 915

(51) Int. Cl.
 *H01L 21/8238* (2006.01)
(52) U.S. Cl. ........................................ 438/199; 257/190
(58) Field of Classification Search .................. 438/199, 438/300; 257/190, E21.403, E29.246
 See application file for complete search history.

(56) References Cited

U.S. PATENT DOCUMENTS

| | | | |
|---|---|---|---|
| 6,891,192 B2 | 5/2005 | Chen et al. | |
| 7,605,407 B2 * | 10/2009 | Wang | 257/191 |
| 7,611,951 B2 * | 11/2009 | Ueno et al. | 438/300 |
| 2006/0172511 A1 * | 8/2006 | Kammler et al. | 438/481 |
| 2008/0067545 A1 * | 3/2008 | Rhee et al. | 257/190 |
| 2008/0121929 A1 * | 5/2008 | Lai et al. | 257/190 |

OTHER PUBLICATIONS

Foreign Associate Transmittal Letter dated Jan. 21, 2008.
Translation of Official Communication Issued Nov. 22, 2007.

* cited by examiner

*Primary Examiner* — David Vu
*Assistant Examiner* — Shaun Campbell
(74) *Attorney, Agent, or Firm* — Williams, Morgan & Amerson, P.C.

(57) ABSTRACT

A new technique enables providing a stress-inducing alloy having a highly stress-inducing region and a region which is processable by standard processing steps suitable for use in a commercial high volume semiconductor device manufacturing environment. The regions may be formed by a growth process with a varying composition of the growing material or by other methods such as ion implantation. The highly stress-inducing region near the channel region of a transistor may be covered with an appropriate cover.

10 Claims, 6 Drawing Sheets

SEMICONDUCTOR DEVICE HAVING A STRAINED SEMICONDUCTOR ALLOY CONCENTRATION PROFILE

BACKGROUND OF THE INVENTION

1. Field of the Invention

Generally, the present disclosure relates to the fabrication of integrated circuits, and, more particularly, to the formation of semiconductor devices having a strained semiconductor alloy concentration profile.

2. Description of the Related Art

The fabrication of complex integrated circuits requires the provision of a large number of transistor elements, which are used in logic circuits as efficient switches and which represent the dominant circuit element for designing circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A transistor or MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, may be required in the drain and source regions to provide low sheet and contact resistivity in combination with a desired channel controllability. Moreover, the gate dielectric material may also be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer next to the channel region to induce a compressive stress that may result in a corresponding strain. The transistor performance of P-channel transistors may be considerably enhanced by the introduction of stress-creating layers next to the channel region. For this purpose, a strained silicon/germanium layer may be formed in the drain and source regions of the transistors, wherein the compressively strained drain and source regions create uniaxial strain in the adjacent silicon channel region. When forming the silicon/germanium layer, the drain and source regions of the PMOS transistors are selectively recessed, while the NMOS transistors are masked, and the silicon/germanium layer is subsequently selectively formed in the PMOS transistor by epitaxial growth. For generating a tensile strain in the silicon channel region, silicon/carbon may be used instead of silicon/germanium. However, an appropriate design may have to be used that balances the performance gain of the PMOS and the NMOS transistor.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that involves providing a stress-inducing alloy having a highly stress-inducing region and a region which is processable by standard processing steps suitable for use in a commercial high volume semiconductor device manufacturing environment.

One illustrative semiconductor device is presented which comprises a transistor. A first semiconductor material comprises a channel region for the transistor and a second semiconductor material positioned in the first semiconductor material. The second semiconductor material generates a strain in the first semiconductor material, wherein the second semiconductor material comprises a first alloy component and a second alloy component, and wherein the second semiconductor material comprises a first region having a higher concentration of the second alloy component than a second region of the second semiconductor material.

One illustrative method disclosed herein comprises providing a semiconductor device comprising a transistor with a channel region, wherein the channel region comprises a first semiconductor material. The method further comprises forming a second semiconductor material in a portion of the first semiconductor material, wherein the second semiconductor material induces a strain in the first semiconductor material and wherein the second semiconductor is an alloy comprising a first alloy component and a second alloy component. Forming the second semiconductor material comprises forming a first region and a second region of the second semiconductor material, wherein the first region has a higher concentration of the second alloy component than the second region of the second semiconductor material.

According to another illustrative embodiment, a method is presented comprising providing a substrate comprising a first semiconductor material and growing a second semiconductor material in a portion of the first semiconductor material in an area adjacent a channel region of a transistor, the second semiconductor material comprising an alloy comprising a first alloy component and a second alloy component with a varying concentration of the second alloy component.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that throughout this application "%" means "atomic %" unless otherwise specified. Throughout this application, the term "semiconductor device" includes a semiconductor device in any manufacturing stage, e.g., in an intermediate manufacturing stage or a finished semiconductor device. The term "source/drain region" includes, but is not restricted to, source/drain regions in a final manufacturing stage. For example, this term does not imply whether a desired doping profile is present in the source/drain region or not. The term "channel region" includes, but is not restricted to, a final manufacturing stage of the channel region of a transistor. Rather, the term channel region indicates the spatial position of the region where, in a final manufacturing stage of a transistor, a conductive channel of the transistor may be built up by applying a respective gate voltage to a gate electrode close to the channel region. The term "silicon/germanium" or "Si/Ge" refers to a silicon/germanium alloy.

Generally, the present disclosure relates to a technique for increasing stress transfer into a channel region of a transistor, thereby increasing charge carrier mobility and the overall performance of the transistor while at the same time allowing for standard processing of the strain-inducing regions, e.g., strain-inducing source/drain regions.

An epitaxial growth of silicon/germanium taking place in the active silicon drain and source area in a P-type metal oxide semiconductor field effect transistor (MOSFET) may result in great performance benefits due to the transfer of uniaxial strain into the channel region. The amount of strain passed into the channel region can be modulated by both the proximity of the silicon/germanium (Si/Ge) region to the channel and the concentration of germanium in the Si/Ge epitaxial region. Patterned film depositions (spacers) may be used to carry out advanced source/drain engineering to reduce diffusion and resistance of submicron devices.

Taking advantage of increased concentration of germanium in Si/Ge growth may make the Si/Ge more susceptible to attack from the standard processing steps, e.g., wet cleans or silicidation processes, in a commercial high volume semiconductor manufacturing environment. This weakness may result in a loss of the epitaxial Si/Ge during processing, a decrease in performance and an increase in structural defects. Solutions to this problem can be varied but most involve extra layering, masking or another form of protection for the vulnerable epitaxial growth material. All those options are time-consuming processes that are expensive and undesirable for high volume semiconductor device manufacturing. According to an illustrative embodiment disclosed herein, high germanium content Si/Ge may be included in current processes by using existing structural members of the device to protect the high germanium concentration Si/Ge from process attack at the critical stress-inducing point, next to the channel, while combining the benefits those members normally contribute to the device. The subject matter disclosed herein combines the advantages of high germanium content Si/Ge, close Si/Ge proximity and the advanced source/drain engineering spacer while protecting the Si/Ge and requiring few structural changes.

It should be appreciated that, although the embodiments disclosed herein may be highly advantageous in combination with highly scaled MOS transistors as are typically fabricated in advanced CMOS techniques including transistors having a gate length of 50 nm and even less, the principles disclosed herein may also be applied to less critical applications so that, for existing designs, a significant performance increase may be obtained.

Figure 1A:
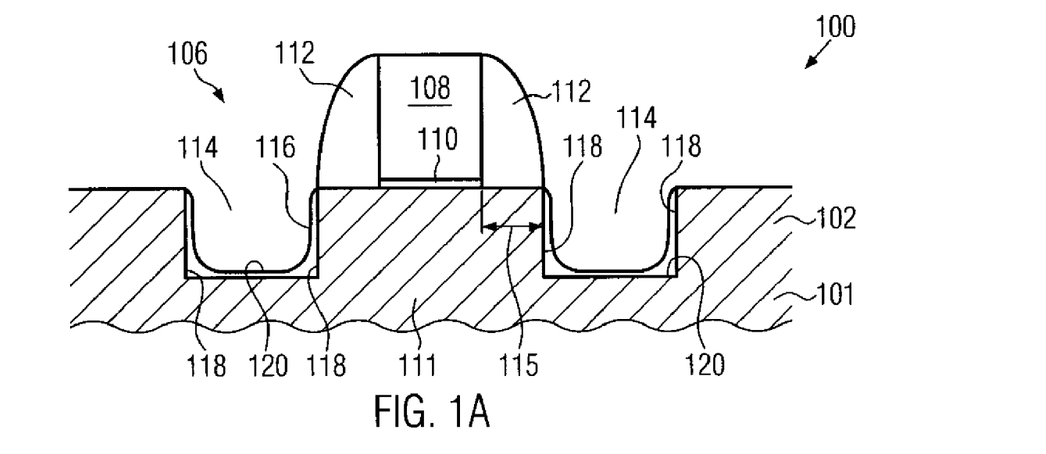
FIGS. 1A-1F schematically illustrate cross-sectional views of a semiconductor device or a part thereof during various manufacturing stages in forming a source/drain region having regions of different composition according to illustrative embodiments.

FIG. 1A shows a cross-sectional view of a semiconductor device 100 in an early, first manufacturing stage. The semiconductor device 100 comprises a semiconductor layer 102 of a first semiconductor material 104 in and/or on which circuit elements, such as transistors, capacitors, resistors and the like, may be formed. The semiconductor layer 102 may be provided on a substrate (not shown), e.g., on a bulk semiconductor substrate or a semiconductor-on-insulator (SOI) substrate, wherein the semiconductor layer 102 may be formed on a buried insulation layer. The semiconductor layer 102 may be a silicon-based crystalline semiconductor layer comprising silicon with a concentration of at least 50%. In illustrative embodiments, the semiconductor layer 102 may represent a doped silicon layer as is typically used for highly complex integrated circuits having transistor elements with a gate length around 50 nm or below.

The semiconductor device 100 in FIG. 1A comprises a transistor 106 in an early manufacturing stage. In this stage, a gate electrode 108 may be formed above the semiconductor layer 102. The gate electrode 108 may be formed of doped polysilicon or other suitable material which is provided above the semiconductor layer 102 and is separated therefrom by a gate insulation layer 110. In other embodiments, the gate electrode 108 may be a replacement or dummy gate electrode which may be removed in a later manufacturing stage and may be replaced by a conductive material of enhanced electrical characteristic. The first semiconductor material 104 forms the channel region 111 for the finished transistor 106.

Sidewalls of the gate electrode 108 are provided with disposable sidewall spacers 112. The disposable sidewall spacers 112 may consist of any appropriate dielectric material, such as silicon nitride, silicon dioxide or mixtures thereof. The disposable sidewall spacers 112 may be used as an etch and growth mask in an etch process and an epitaxial growth process for the formation of an embedded strained semiconductor region.

The semiconductor device 100 of FIG. 1A further comprises a recess or cavity 114 which may be formed by a well-established anisotropic etch process, using the spacer 112 as a mask. Therefore, the disposable sidewall spacers 112 determine the lateral distance 115 of the gate electrode 108 and the cavity 114.

Figure 1B:
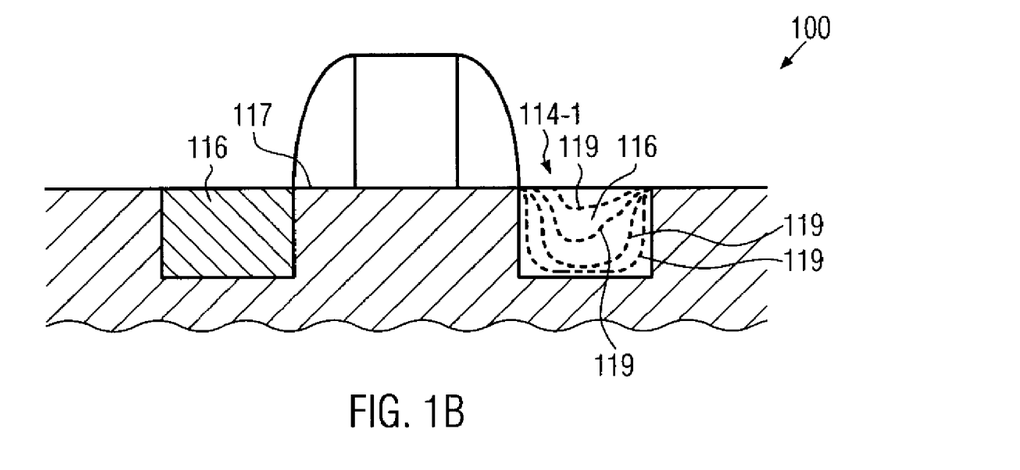

It should be appreciated that, after the formation of the cavity 114, the semiconductor device 100 may be subjected to any necessary or suitable pretreatments for preparing the device 100 for a subsequent epitaxial growth process. Thereafter, a second semiconductor material 116 (see FIG. 1B) is grown in the cavity 114. The second semiconductor material 116 comprises a first alloy component and a second alloy component. In an illustrative embodiment, the first alloy component is silicon and the second alloy component is germanium. The growth of the second semiconductor material 116 in the cavity 114 may be performed by using a selective epitaxial growth process using the material of the cavity bottom and/or sidewalls as a template. In one illustrative embodiment, an appropriate deposition atmosphere may be established comprising a silicon-containing precursor material and a germanium-containing precursor material. Typically, in selective epitaxial growth processes, the process parameters, such as pressure, temperature, type of carrier gases and the like, are selected such that substantially no material is deposited on dielectric surfaces, such as the surfaces of the spacer 112 and a possible capping layer (not shown), while a deposition is obtained on exposed surfaces of the first semiconductor layer 102, thereby using this layer as a crystalline template which substantially determines the crystalline structure of the epitaxially grown second material 116. Since the covalent radius of germanium is larger than the covalent radius of the silicon, growing the silicon/germanium material on a silicon template results in a strained silicon/germanium layer which induces a compressive strain in the channel region 111. It should be appreciated that any appropriate second semiconductor material may be used, depending on the type of the first semiconductor material and the desired strain type in the first semiconductor material. For example, in other embodiments, which use silicon or a silicon-based material as the first semiconductor material, the second semiconductor material may be silicon/carbon (Si/C) for inducing a tensile strain in the channel region 111.

Experiments have revealed that when silicon/germanium is grown in a cavity 114, it preferentially grows along a sidewall 118 of the cavity 114 at a rate faster than on the bottom 120 of the cavity 114. As the silicon/germanium epitaxy continues, the silicon/germanium begins to fill from the bottom faster and begins to fill up the cavity 114 more completely. At the end of the growth (FIG. 1B), the cavity 114 is filled substantially flush with the surface 117 of the active silicon in the channel region 111. Further, due to the nature of epitaxial growth, it is possible to vary the germanium content of the growth in situ by varying growth conditions, e.g., by varying at least one of a gas flow, a temperature, a pressure of the atmosphere, etc. Thus, it is possible to fill the cavity 114, taking advantage of its growth mechanism, in such a way that results in a decreasing germanium concentration in a focused manner with concentration decreasing moving away from sidewalls 118 and bottom 120 of the cavity 114 towards the middle and top of the cavity 114. In the right cavity 114-1, shown in FIG. 1B, the dotted lines 119 indicate regions of constant germanium concentration, thereby indicating the concentration profile of the germanium concentration in the silicon/germanium material in the cavity 114. It should be noted that, in the illustrated embodiment, the germanium concentration profile is a continuous profile, due to continuous adjustment of the process parameters. In other embodiments, the process parameters are varied discontinuously, leading to a discontinuous concentration profile of the second semiconductor material.

Figure 1C:
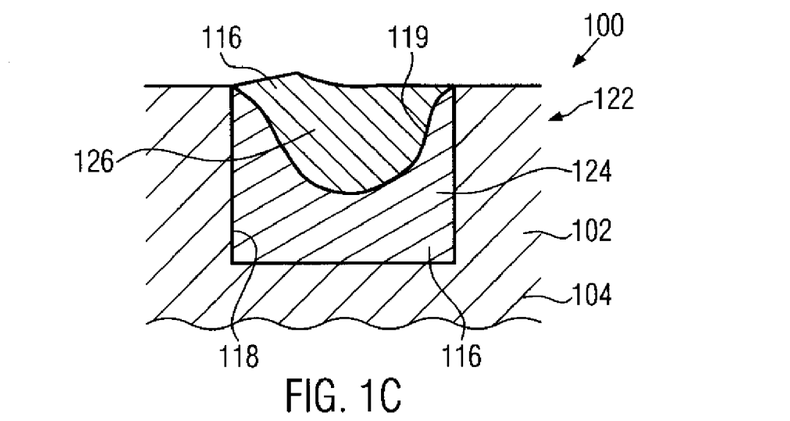

FIG. 1C shows an embodiment of a source/drain region 122 illustrating the fact that, even in a second semiconductor material 116 having a continuous concentration profile of the concentration of the second alloy component, each surface or line 119 of constant germanium concentration defines a first region 124 and a second region 126 of the second semiconductor material 116, wherein the first region 124 has a higher concentration of the second alloy component than the second region 126. Other lines of constant germanium concentration in the second semiconductor material 116 are indicated at 119'.

Figure 1D:
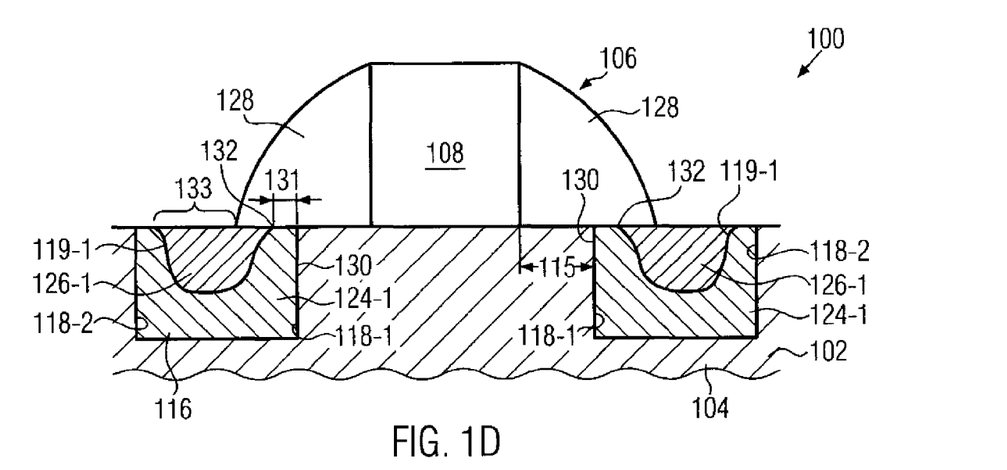

FIG. 1D shows the semiconductor device 100 in a further advanced manufacturing stage. The disposable sidewall spacers 112 have been removed, for example, by a selective anisotropic etch process, recipes of which are well established. Thereafter, a sidewall spacer 128 is formed adjacent the gate electrode 108. The sidewall spacer 128 may be formed according to well-known principles and recipes, e.g., by forming a dielectric layer of an appropriate material and patterning the dielectric layer to thereby form the sidewall spacer 128. Patterning the dielectric layer may include performing a anisotropic etch process, ending up with the formation of the sidewall spacers 128. Further illustrated in FIG. 1D is a line 119-1 of constant germanium concentration which defines a first region 124-1 of the second semiconductor material and a second region 126-1 of the second semiconductor material, wherein, in the first region 124-1, the germanium concentration is higher than in the second region 126-1. In the illustrated embodiment in FIG. 1D, the line 119-1 indicates a specific germanium concentration, thereby defining a first region 124-1 having a germanium concentration higher than the specific germanium concentration and defining a second region 126-1 having a germanium concentration lower than the specific germanium concentration. According to an illustrated embodiment, the specific germanium concentration indicated at 119-1 may correspond to a germanium concentration which defines the second region 126-1 such that this region is not adversely affected by a particular process which is carried out on the second region 126-1. According to an embodiment, the germanium content in the second region 126-1 is low enough to withstand the standard processing, i.e., to provide enough resistance to the standard processing the device would undergo after the growth of the second semiconductor material 116, such that the proper operation of the semiconductor device 100 is not adversely affected. As illustrated, an interface 130 between the first semiconductor material and the second semiconductor material is formed by the first region 124-1 of the second semiconductor material 116 and the first semiconductor material. In other embodiments, the interface 130 is formed in part by the first region 124-1 of the second semiconductor material 116 and in part by the second region 126-1 of the second semiconductor material 116.

Due to the nature of the described growth of the second semiconductor material 116 with different concentrations of the second alloy component, there is a place in the horizontal plane of growth a specific distance 131 away from the interface 130, a critical point 132, where the concentration of the second alloy component 116 transitions to a concentration that is low enough to withstand the standard processing the device would undergo after growth of the second semiconductor material. It should be appreciated that an above-mentioned preferential growth of the second semiconductor material 116 along the sidewall 118 of the cavity 114 at a rate faster than on the bottom 120 of the cavity 114, as is the case for silicon/germanium, is not necessary for carrying out the illustrated embodiment of the invention. Rather, it is only necessary that the second semiconductor material 116, together with an appropriate choice of process parameters, provides the ability to grow the second semiconductor material 116 with a high concentration of the second alloy component at the interface 130 to the first semiconductor material 104 and grow the second semiconductor material 116 with a low concentration of the second alloy component at a surface portion of the second semiconductor material 116.

In accordance with one illustrative embodiment, the semiconductor device 100 comprises a cover which is positioned over a surface portion of the first region 124-1 close to the channel region 111, wherein, in the illustrated embodiment, the cover is provided in the form of the spacers 128. In the illustrated embodiment, the cover, i.e., the spacer 128, extends over the critical point 132. The cover protects the underlying first region 124-1 of the second semiconductor material 116 from process attack, e.g., a silicidation process. In one illustrative embodiment, the cover 128 is substantially immune to serious attack during the subsequent steps after formation of the second semiconductor material 116 in the cavity 114, and it provides a bulwark for the sensitive first region 124-1, at least for the portion near the channel region 111. The cover 128 leaves an uncovered surface portion 133 unprotected which may be subjected to further processing.

The first region 124-1 is also formed at a sidewall 118-2 of the cavity 114 opposite a sidewall 118-1 at which the interface between the first semiconductor material 102 in the channel region 111 and the second semiconductor material 116 is formed. However, since the first region 124-1 of the second semiconductor material 116 at the sidewall 118-2, farther from the channel region 111, does not substantially contribute to the stress/strain in the channel 111, it may not be unnecessary to protect it from process attack. Thus, it is necessary to only protect the second semiconductor material 116 up to the critical point 132 nearest the channel region 111. According to an embodiment disclosed herein, the proximity 115 of the cavity 114, controlled by the disposable spacer 112 of proper material, can be reduced and then a spacer of appropriate material which is normally used for source/drain engineering can be placed on the device in such a manner that it covers the second semiconductor material 116 up to and slightly beyond the critical point 132.

Figure 1E:
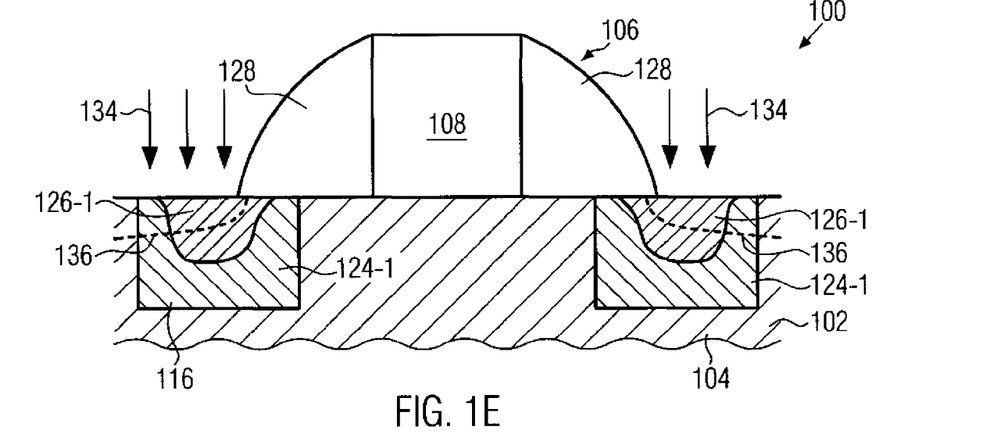

FIG. 1E shows the semiconductor device in a further manufacturing stage, wherein at least one doping step 134 is performed to generate a desired dopant profile 136 in the second semiconductor material 116. The doping process 134 may include an implantation process where dopant is implanted in the second semiconductor material 116. In this embodiment, the spacer 128 also serves as an implantation mask for the dopant. It should be appreciated that the concentration of the dopant in the second semiconductor material 116 may be at least one order of magnitude lower than the concentration of the second alloy component. For example, for silicon/germanium, a concentration of the second alloy component germanium may be between approximately 1-50%, or between approximately 10-35%, and, for example, for silicon/carbon, a concentration of the second alloy component carbon may be between approximately 0.0-1% or between approximately 0.01-0.1%. In other embodiments, the configuration of the spacer 128 may be different from the illustrated exemplary embodiment, e.g., a sidewall spacer structure including a plurality of individual spacer elements separated by respective lines may be used (not shown).

Figure 1F:
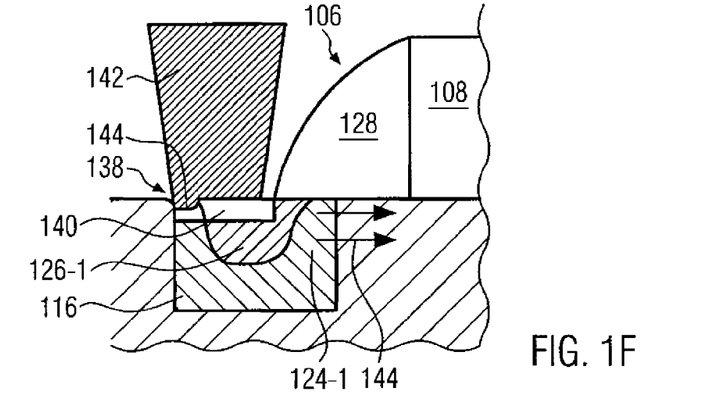

In accordance with one embodiment disclosed herein, the uncovered surface portion 133 of the second semiconductor material 116 comprises a surface portion of the second region 124-1 of the second semiconductor material 116 and may form a contact portion 138. According to one embodiment, the contact portion 138 may include a metal silicide 140, as shown in FIG. 1F, which illustrates a further advanced manufacturing stage of the semiconductor device 100. In an exemplary embodiment, the metal silicide 140 is a highly conductive nickel silicide. However, it should be appreciated that any other suitable metal silicide may be used. Further, in other embodiments, the contact portion 138 does not include a metal silicide. The contact portion 138 is contacted with a suitable contact material 142, e.g., with a metal. According to one embodiment, suitable contact materials comprise at least one of aluminum, tungsten and copper. The contact material 142 may be formed in a hole in a dielectric layer (not shown) which covers the transistor 106. Further, illustrated in FIG. 1F is the loss of the second semiconductor material in the first region 124-1 far from the channel region. This loss in the second semiconductor material may occur, e.g., during a wet cleaning process or a silicidation process and results in a recess 144 which may be filled with the contact material 142, as is illustrated in FIG. 1F.

Due to the cover 128, the first region 124-1 of the second semiconductor material 116 is protected from attack by the standard processing, e.g., the silicidation process, and consequently a high strain can be induced in the channel region, indicated by the arrows 144 in FIG. 1F.

While at least some of the basic principles of the invention have been described with reference to FIG. 1A-1F, further modifications are possible, some exemplary of which will be described with reference to FIGS. 2-5B. The discussion of individual features and its variations is not repeated in the following, but generally reference is made to the embodiments and variations discussed with regard to FIG. 1A-1F. In order to support the understanding of such general reference, in the drawings like numerals indicate like elements. For example the reference numbers 124, 224, 324, 424, 524 indicate a first region of a second semiconductor according to respective embodiments of the invention.

Figure 2:
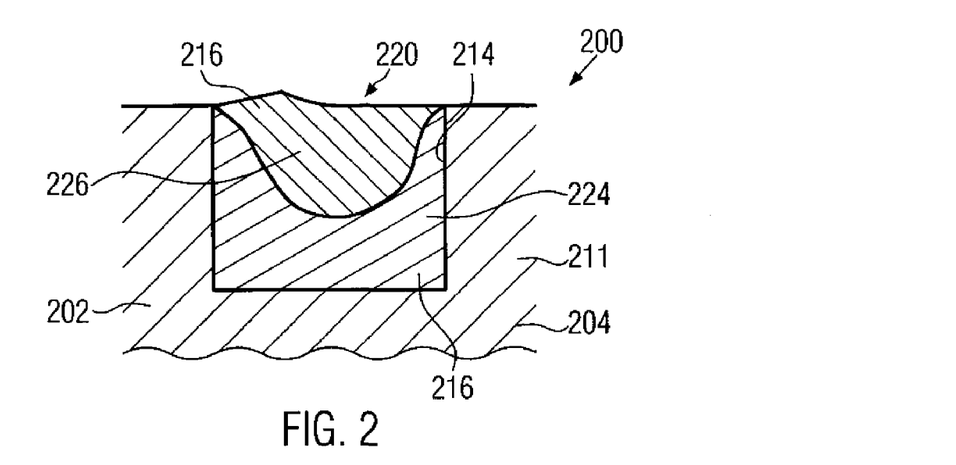
FIG. 2 schematically illustrates a cross-sectional view of a semiconductor device comprising a transistor having a source/drain region with a stepwise concentration profile of a second alloy component according to another illustrative embodiment.

FIG. 2 shows a further embodiment of a semiconductor device 200 having a source/drain region 222. A cavity 214 is formed in a semiconductor layer 202 close to a first semiconductor material 204 in a channel region 211 of a transistor and is filled with a second semiconductor material 216. The source/drain region 222 differs from the source/drain region illustrated in FIG. 1C in that the concentration profile of a second alloy component of the second semiconductor material 216 is a stepwise concentration profile. Thus, the second semiconductor material 216 in the cavity 214 consists of a first region 224 having a first concentration of the second alloy component and a second region 226 having a second concentration of the second alloy component. Such a stepwise concentration profile may be obtained by changing the process parameters during growth of the second semiconductor material 216 in a stepwise manner. It should be appreciated that, while the source/drain region shown in FIG. 2 has only two regions 224, 226 of different concentration of the second alloy component, according to other embodiments, three or more regions of different concentration of the second alloy component may be provided.

Figure 3:
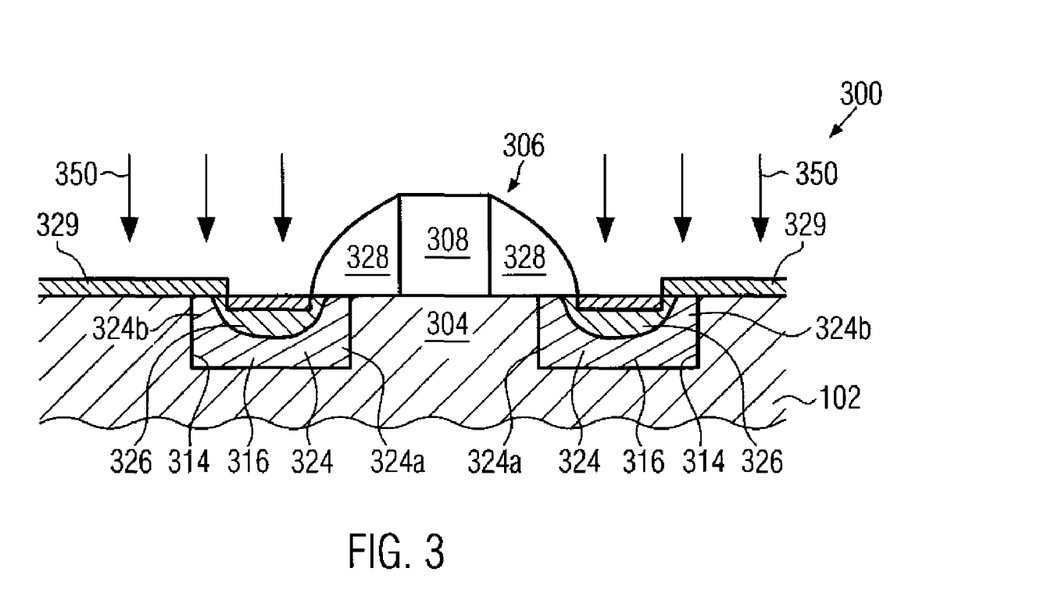
FIG. 3 schematically illustrates a cross-sectional view of a semiconductor device having a silicidation area only in region of a relatively lower concentration of a second alloy component according to another illustrative embodiment.

FIG. 3 shows details of a manufacturing stage of a further embodiment of a semiconductor device wherein the metal silicide is formed only in the second region of the second semiconductor material 316, which has the relatively lower concentration of the second alloy component. To this end, a cover 328, 329 is provided at least over the whole surface portion of a first region 324 of a second semiconductor material 316 which comprises a first alloy component and a second alloy component. The first region 324 has a higher concentration of the second alloy component than a second region of the second semiconductor material 316. The second semiconductor material 316 may be formed in a cavity 314 and may function as a source/drain region of a transistor 306. The cover comprises a sidewall spacer 328 adjacent a gate electrode 308 which extends over a near portion 324a of the first region 324 close to a channel region 304 of the transistor 306, as well as a cover layer 329 over a far portion 324b of the first region 324 which is located in the cavity 314 opposite the near portion 324a. FIG. 3A further illustrates a silicidation process 350 for forming a metal silicide 140 in the second semiconductor material 116.

Figure 4A:
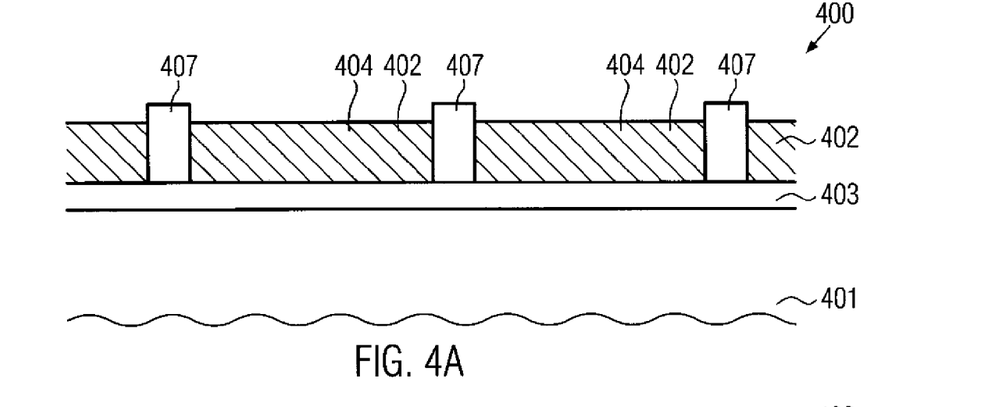
FIGS. 4A-4D schematically illustrate cross-sectional views of a semiconductor device comprising two different transistor types during various manufacturing stages in forming a source/drain region having regions of different composition according to another illustrative embodiment.

FIG. 4A-4D show a further embodiment of a semiconductor device 400 according to an illustrative embodiment disclosed herein. FIG. 4A shows an early manufacturing stage of the semiconductor device 400. A semiconductor layer 402 is provided above a buried oxide layer 403 which is provided on a substrate 401. The substrate 401 may consist of silicon, may be a silicon-based substrate or may be formed of any other suitable material. The buried oxide layer 403 may be formed of silicon dioxide in an exemplary embodiment. Active regions comprising a first semiconductor material 404 of a channel region of individual transistors may be defined by appropriate isolations structures 407, e.g., shallow isolations.

Figure 4B:
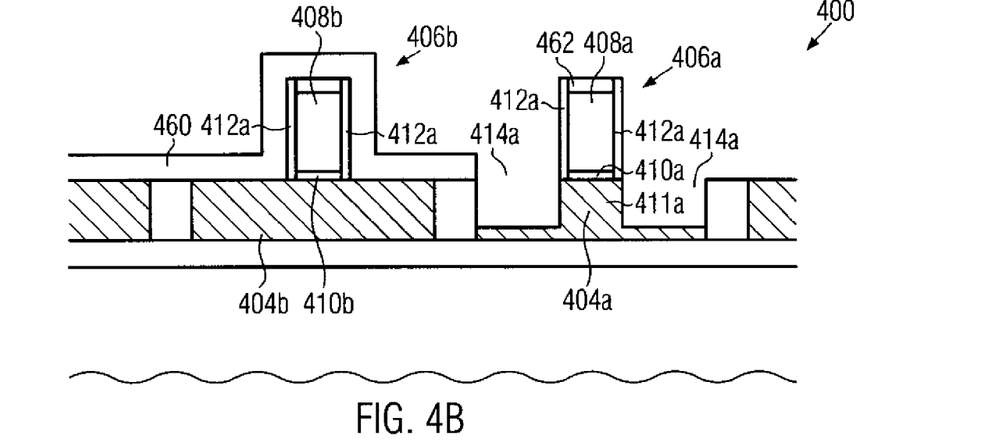
Figure 4C:
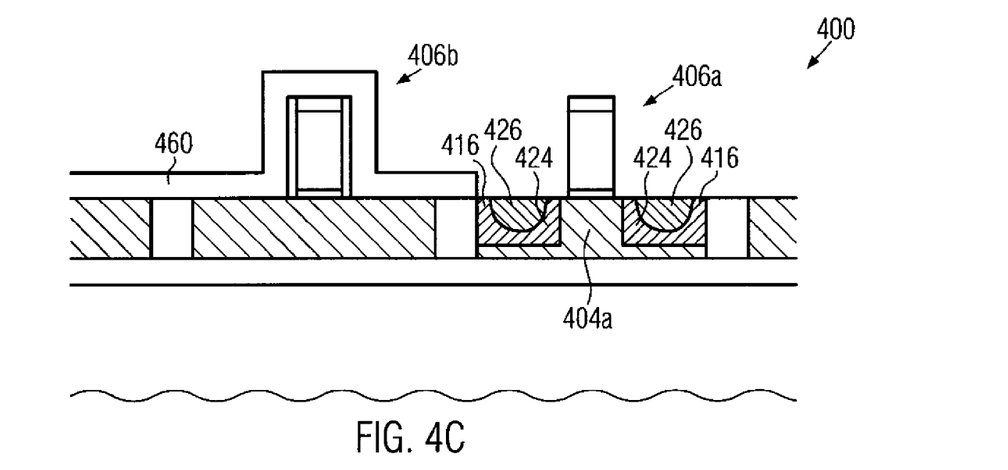

FIG. 4B shows a further advanced manufacturing stage of the semiconductor device 400. Herein, gate electrodes 408a, 408b of transistors 406a, 406b have been formed above the first semiconductor material 404. In the illustrated embodiment, a first transistor 406a is a P-channel transistor and second transistor 406b is an N-channel transistor. In FIG. 4B, cavities 414a have been formed by a selective anisotropic etch process in source/drain regions of the first transistor 406a, while the second transistor 406b is covered with a appropriate mask layer 460. Disposable spacers 412 serve as a mask for the etch process in order to control the proximity of the cavities relative to the channel region 411 below the gate electrode 408a, 408b and the respective gate insulating layer 410. In the embodiment of semiconductor device 400, the gate electrodes 408a, 408b are covered with a capping layer 462.

Figure 4D:
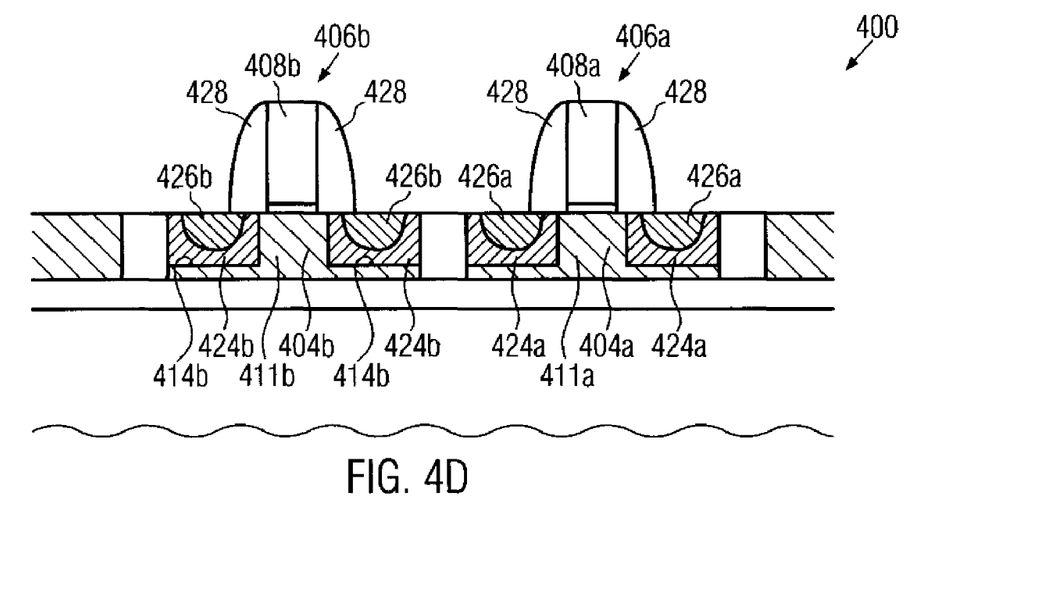

The cavities 414 are filled with a second semiconductor material 416 comprising a first alloy component and a second alloy component. A first region 424 and a second region 426 of the second semiconductor material 416 are formed, e.g., by adjusting the process parameters of the growth process of the second semiconductor material 416 such that a concentration of a second alloy component of the second semiconductor material 416 is higher in the first region 424 compared to the second region 426. Thereafter, the disposable sidewall spacers 412 are removed by an appropriate removal process and a cover 428 is formed over the first region 424 close to the channel region 411 formed of the first semiconductor material 404 (FIG. 4D). In the embodiment of the semiconductor device 400, the first alloy component of the second semiconductor material 416 is silicon and the second alloy component of the second semiconductor material 416 is germanium.

The second transistor 406b may be formed by using processes similar to those used for forming the first transistor 406a, except that the material in the source/drain region of the second transistor 406b are different from the material in the source/drain region of the first transistor 406a. The second transistor 406b may comprise a third semiconductor material 404b in the channel region 411b. In the illustrated embodiment, the third semiconductor material 404b is identical to the first semiconductor material 404a and is formed from the same layer 402. The recesses 404b in the source/drain regions of the second transistor 406b are filled with a fourth semiconductor material 416b comprising a third alloy component and a fourth alloy component. For example, the third alloy component may be silicon and the fourth alloy component may be carbon. Accordingly, since the covalent radius of carbon is smaller than the covalent radius of silicon, a tensile strain is generated in the channel region 411b of the second transistor 406b. In the illustrated embodiment, the fourth material of the second transistor comprises a first region 424b having a first concentration of the fourth component which is higher than a second concentration of the fourth component in a second region 426b of the fourth semiconductor material 416b. The stress-inducing portion of the first region 424b of the fourth semiconductor material 416b is protected by a cover 428.

In the illustrated embodiment of FIG. 4D, the cover 428 of the first transistor 406a and the cover 428 of the second transistor are formed simultaneously from a same dielectric layer. According to other embodiments, the cover 428 of the first and second transistor are formed subsequently by using at least one appropriate mask layer.

Figure 5A:
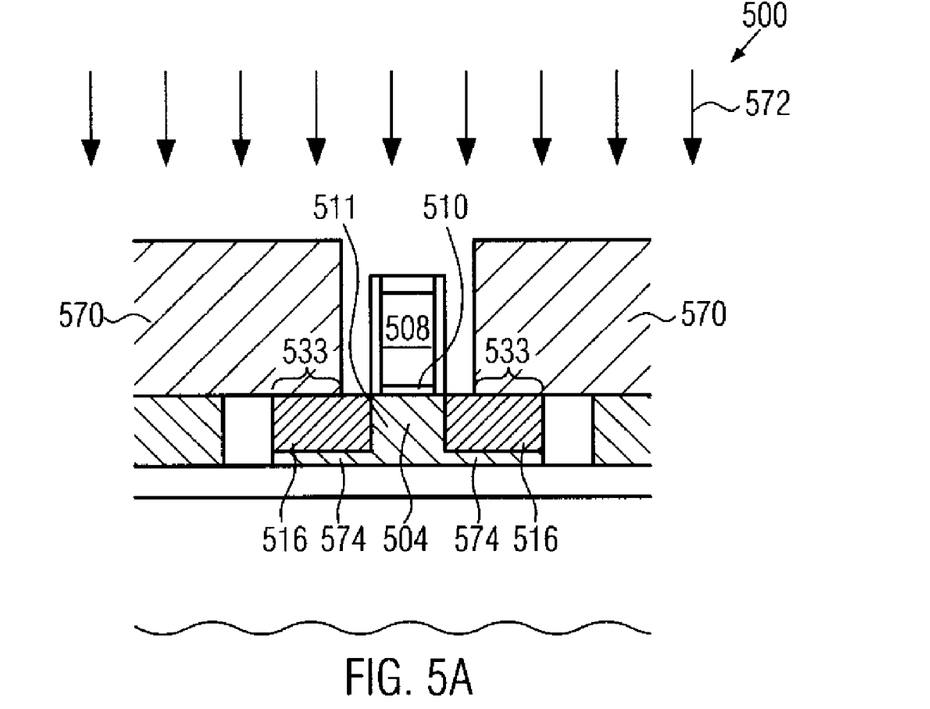
FIGS. 5A-5B schematically illustrate cross-sectional views of a semiconductor device comprising source/drain regions having regions of different composition, wherein the different composition is generated by an implantation technique according to a further illustrative embodiment.
Figure 5B:
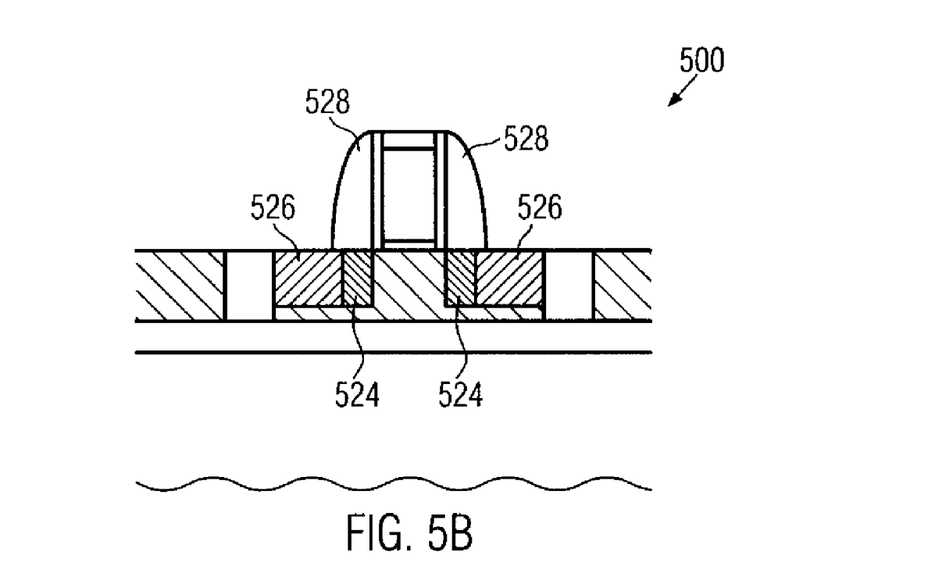

While at least some of the above-mentioned embodiments generate the regions of different alloy component concentration in the semiconductor material, FIG. 5A-5B illustrate an alternative method of how the regions of different alloy component concentration can be obtained.

The embodiment shown in FIGS. 5A-5B uses ion implantation for introducing at least part of a specific component into a region of a transistor 506 of a semiconductor device 500. The transistor 506 comprises a channel region 511 comprising a first semiconductor material 504. A gate electrode 508 and a gate insulating layer 510 are provided over the channel region 511. In the manufacturing stage illustrated in FIG. 5A, a cavity 514 has been filled with a second semiconductor material 516 comprising a first and a second semiconductor alloy component. In the illustrated embodiment, the cavity 514 has been formed in a source/drain region of the transistor 506. The second semiconductor material deposited in the cavity 514 has a substantially homogenous initial concentration of the second alloy component. In FIG. 5A, an implantation mask 570 of a suitable material which is well known in the art is provided over a portion of the second alloy component in the cavity 514. In one embodiment, the implantation mask 570 covers at least a contact portion 533 of the second semiconductor material 516.

By an appropriate implantation process 572, e.g., an ion implantation process, for implanting the second alloy component in the second semiconductor material, the concentration of the second alloy component is increased in a first region 524 of the second semiconductor material 516 which is not covered by the implantation mask 570, e.g., a resist mask (FIG. 5B). The region of the second semiconductor material which is covered by the implantation mask maintains its initial concentration of the second alloy component and hence forms a second region 526 of the second semiconductor material 516.

The implantation parameters of the process 572 may be selected on the basis of well-established simulation models in order to obtain an implantation energy for substantially depositing the second alloy component ions within the second semiconductor material 516 without unduly damaging the "template layer" 574 which acts as a template for the crystal structure of the second semiconductor material. After the completion of the implantation process 572, the resist mask 570 may be removed and the device 500 may be subjected to an anneal process for re-crystallizing damaged portions in the second semiconductor material and for substantially placing the implanted species at lattice sites so as to rebuild the strained lattice in the second semiconductor material. Due to the increased concentration of the second alloy component in the vicinity of the channel region 510, an even increased compressive strain may be generated therein, thereby also causing a more efficient modification of the charge carrier mobility. As discussed with regard to the other embodiments, a spacer 528 may be formed on the first region 524 of the second semiconductor material 516 in order to protect the first region from attack of further processing, e.g., silicidation.

It should be appreciated that the above-described embodiment is only of an illustrative nature and a variety of modifications may be considered. For example, the implantation process may be performed prior to the formation of the gate electrodes while covering the channel region by an appropriate mask. Further, instead of generating a cavity and filling the cavity with the second semiconductor material, the second semiconductor material including the first and second regions thereof may be formed by only implanting the second alloy component in the first semiconductor material which includes or consists of the first alloy component. For example, a silicon/carbon semiconductor alloy may be generated by implanting carbon in the silicon using appropriate masking layers.

The above-described embodiments employing implantation techniques are, in particular, suitable for semiconductor alloys having a relatively low content of the second component, e.g., for silicon/carbon. However, these embodiments are also suitable for semiconductor alloys having a relatively high concentration of the second component, e.g., silicon/germanium.

As a result, the subject matter disclosed herein provides a new technique that enables providing a stress-inducing alloy having a highly stress-inducing region and a region which is processable by standard processing steps suitable for use in a commercial high volume semiconductor device manufacturing environment. The regions may be formed by a growth process with a varying composition of the growing material or by other methods such as ion implantation. The highly stress-inducing region near the channel region of a transistor may be covered with an appropriate cover. Another aspect provides a technique for providing a high strain in a channel region of a transistor while reducing the susceptibility to attack from standard processing steps in a commercial high volume semiconductor manufacturing environment. A combination of the appropriate concentration profile in the source/drain region with an appropriate spacer may be used which protects a high second alloy component concentration in the second semiconductor material near the stress-inducing interface between the first semiconductor material in the channel region and a second stress-inducing semiconductor material. The unprotected region of the second semiconductor material may be subjected to further processing. The further processing may be performed without change with regard to conventional processing while maintaining all the advantage of cavity proximity, higher concentration of the second alloy component, e.g., the germanium in silicon/germanium, and advanced source/drain engineering. Continuing on with the canonical MOSFET fabrication, which can include a low resistance silicidation of the source/drain regions, contacts are etched and filled with an appropriate material effectively filling in for any lost material of the first region of the second semiconductor material at the far edge of the source/drain region.

The principles disclosed herein may be used with a high degree of process compatibility with conventional approaches. Consequently, enhanced overall device performance may be obtained without unduly contributing to process complexity. In one illustrative embodiment, the second semiconductor material may be comprised of silicon/germanium, and the silicon/germanium in the source/drain region of the P-channel transistor may provide enhanced hole mobility in the close-by channel region. In other illustrative embodiments, a semiconductor having a smaller natural lattice constant compared to silicon may be used, thereby inducing inverse strain characteristics compared to the silicon/germanium. In some illustrative embodiments, the formation of a semiconductor material contained in the P-channel transistor and the N-channel transistor of a CMOS transistor may be performed in a common process sequence for both transistors, thereby providing reduced process complexity, while, in other illustrative embodiments, enhanced flexibility on designing the respective characteristics with respect to dopant concentration, type of semiconductor material, concentration gradients therein, may be achieved by separately providing a respective semiconductor alloy in different transistor types. For this purpose, in some illustrative embodiments, efficient selective epitaxial growth techniques may be used in combination with selective etch steps for recessing one or more of the active regions of the transistors in a common process and subsequently refilling the recesses with an appropriate semiconductor material. In still other illustrative embodiments, a semiconductor material, e.g., the second and the fourth semiconductor material of the respective embodiment discussed above, may be formed on the basis of an ion implantation process, wherein appropriate pre-amorphization steps may be used in combination with advanced anneal techniques for re-crystallizing the respective transistor regions after incorporating the desired atomic species for forming the semiconductor alloy. For this purpose, substantially the same process steps may be used as are previously described with reference to FIGS. 1A-4D, wherein, however, instead of selectively recessing the active regions and refilling the same, a corresponding mask may be used for an implantation process without requiring a selective removal of material of the active region. The implantation process may be respectively adapted to achieve the desired concentration profile of the second alloy component or the fourth alloy component, respectively. Furthermore, in this case, the corresponding mask layers may be provided in the form of resist masks, thereby contributing to a reduced process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor device comprising a transistor with a channel region, said channel region comprising a first semiconductor material;
forming a second semiconductor material in a portion of said first semiconductor material, wherein said second semiconductor material induces a strain in said first semiconductor material and wherein said second semiconductor material is an alloy comprising a first alloy component and a second alloy component, wherein said first and second alloy components are non-dopant components and wherein forming said second semiconductor material comprises:
forming a first region of said second semiconductor material;
masking a first portion of said first region;
implanting said second alloy into an unmasked second portion of said first region to define a second region of said second semiconductor material, wherein said second region is disposed closer to said channel region than said first region, said second region has a higher concentration of said second alloy component than said first region of said second semiconductor material, said first region includes a first surface portion, and said second region includes a second surface portion;
covering a portion of said second semiconductor material with a cover, wherein said cover directly contacts at least said second surface portion and a portion of said first surface portion adjacent said second surface portion; and
further processing an uncovered surface portion of said second semiconductor material.

2. The method of claim 1, wherein forming said second semiconductor material comprises:
forming a cavity adjacent said channel region; and
growing said second semiconductor material in said cavity.

3. The method according to claim 1, wherein forming said second semiconductor material comprises growing said first region of said second semiconductor material on said first semiconductor material.

4. The method according to claim 1, wherein forming said second semiconductor material comprises implanting said second alloy component in a base material comprising said first alloy component.

5. The method according to claim 4, wherein forming said second semiconductor material comprises:

forming said second semiconductor material having a first concentration of said second alloy component; and forming said second region having said higher concentration of said second alloy component by implanting said second alloy component in said second semiconductor material.

6. A method, comprising:

providing a substrate comprising a first semiconductor material;

growing a second semiconductor material in a portion of said first semiconductor material in an area adjacent a channel region of a transistor, said second semiconductor material comprising an alloy comprising a first alloy component and a second alloy component with a varying concentration of said second alloy component, wherein said first and second alloy components are non-dopant components and wherein a first region is defined where said varying concentration is greater than a predetermined threshold and a second region where said varying concentration is less than or equal to said predetermined threshold, said first region including a first surface portion and said second region including a second surface portion, said first region including a third surface portion and said second region including a fourth surface portion;

covering a first portion of said second semiconductor material with a first cover, wherein said first cover directly contacts at least said first surface portion and a portion of said second surface portion adjacent said first surface portion;

covering a second portion of said second semiconductor material with a second cover, wherein said second cover directly contacts at least said third surface portion and a portion of said fourth surface portion adjacent said third surface portion; and further processing an uncovered surface portion of said second semiconductor material.

7. The method of claim 6, wherein forming said second semiconductor material comprises:

forming a cavity adjacent said channel region;

growing said second semiconductor material in said cavity; and varying a concentration of said second alloy component in said second semiconductor material during growing said second semiconductor material for providing said first region and said second region of said second semiconductor material.

8. The method according to claim 7, wherein growing said second semiconductor material in said cavity comprises:

growing said second semiconductor material with a first concentration of said second alloy component on a sidewall of said cavity; and growing said second semiconductor material with a second concentration of said second alloy component in the middle and top of said cavity.

9. The method according to claim 6, wherein forming said second semiconductor material comprises growing said first region of said second semiconductor material on said first semiconductor material.

10. The method according to claim 6, wherein forming said second semiconductor material comprises implanting said second alloy component in a base material comprising said first alloy component.

* * * * *